United States Patent [19]
Hashimoto

[11] Patent Number: 5,353,252
[45] Date of Patent: Oct. 4, 1994

[54] SEMICONDUCTOR INTEGRATED CIRCUIT DEVICE HAVING DIGIT LINE BIASING MEANS

[75] Inventor: Kiyokazu Hashimoto, Tokyo, Japan

[73] Assignee: NEC Corporation, Tokyo, Japan

[21] Appl. No.: 692,293

[22] Filed: Apr. 26, 1991

[30] Foreign Application Priority Data

Apr. 27, 1990 [JP] Japan .................................. 2-112406

[51] Int. Cl.[5] .......................................... G11C 7/00
[52] U.S. Cl. .............................. 365/189.09; 365/203
[58] Field of Search ................... 365/185, 189.09, 203, 365/226

[56] References Cited

U.S. PATENT DOCUMENTS

| | | | |
|---|---|---|---|
| 4,156,940 | 5/1979 | Hollingsworth et al. | 365/189.09 |
| 4,594,689 | 6/1986 | Donoghue | 365/189.09 |
| 4,725,986 | 2/1988 | Kouba | 365/203 |
| 4,813,021 | 3/1989 | Kai et al. | 365/203 X |
| 4,817,057 | 3/1989 | Kondo et al. | 365/203 |
| 4,843,594 | 6/1989 | Tanaka et al. | 365/185 |
| 4,943,945 | 7/1990 | Lai | 365/189.09 |
| 5,088,060 | 2/1992 | Endoh et al. | 365/185 |
| 5,237,534 | 8/1993 | Tanaka et al. | 365/203 X |

FOREIGN PATENT DOCUMENTS 0113196  5/1986  Japan .............................. 365/189.09

*Primary Examiner*—Seungsook Ham
*Attorney, Agent, or Firm*—Leydig, Voit & Mayer

[57] ABSTRACT

A semiconductor integrated circuit device includes a plurality of digit lines, a plurality of memory cells, a sense amplifier circuit, a plurality of digit line biasing circuits, and a bias voltage generating circuit. Non-selected digit lines are biased to a predetermined voltage by the bias voltage generating circuit and the digit line bias circuits during the read-out mode, which results in the advantage that the speed in which the selected digit line is charged to the equilibrium values is high, hence the operation speed of the circuit is high. The present invention may be effectively embodied in such an EEPROM which is large in capacity or scale and which requires a high speed operation.

5 Claims, 8 Drawing Sheets

F I G. 3
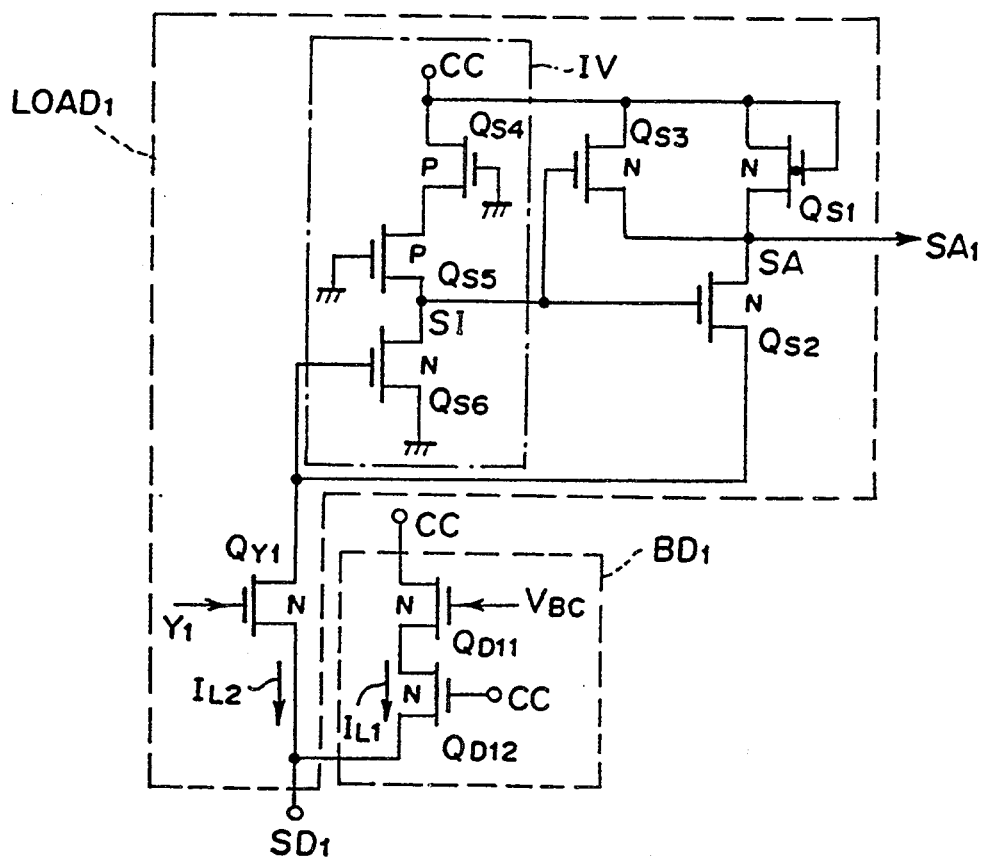
F I G. 4
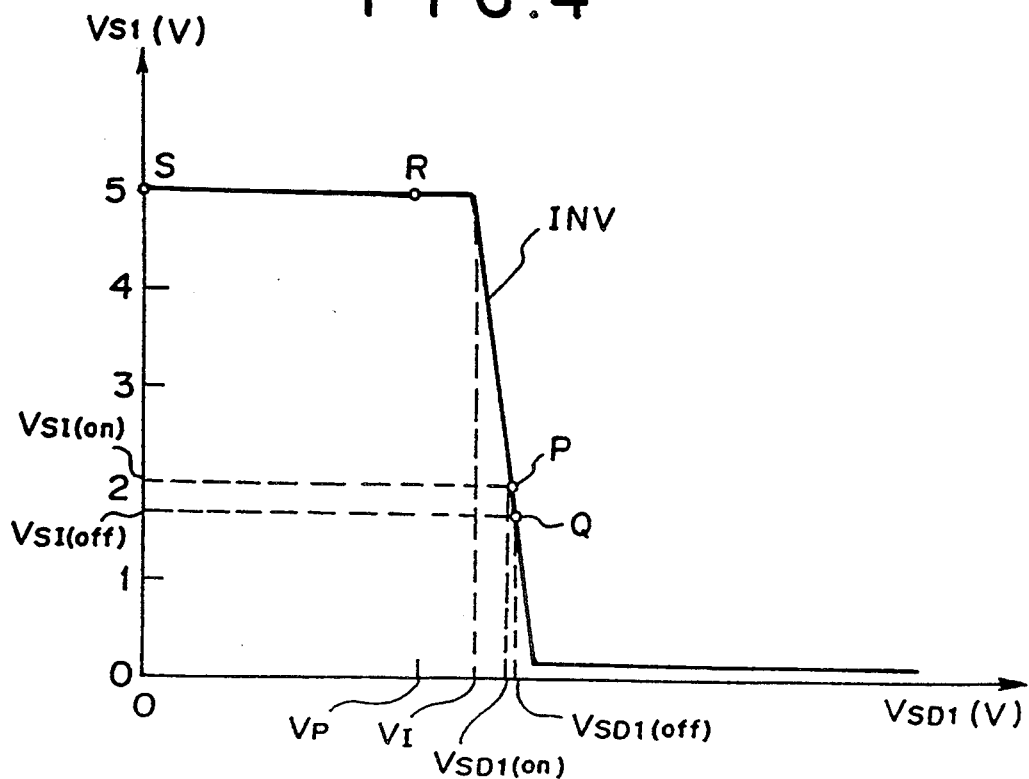

SEMICONDUCTOR INTEGRATED CIRCUIT DEVICE HAVING DIGIT LINE BIASING MEANS

BACKGROUND OF THE INVENTION

The present invention relates to a semiconductor integrated circuit device formed by insulated gate field effect transistors (hereinafter referred to simply as "MOSFET") as main elements and, more particularly, to an electrically erasable programmable ROM (hereinafter referred to as "EEPROM") having a digit line biasing means.

A portion of a prior art read-out circuit of EEPROM is diagrammatically shown in FIG. 7. In the drawings, $Y_1, \ldots, Y_m$ are Y-address lines for selecting Y-addresses of memory cells, $X_1, \ldots, X_n$ are X-address lines for selecting X-addresses of the memory cells, $W_1, \ldots, W_n$ are word lines, Cg is a signal line to which is applied a read-out voltage $V_R$ during the read-out mode, and SS is a common source line of the memory cells, to which the voltage 0 V is applied during the read-out mode.

SENSE is a sense amplifier circuit, REF is a reference circuit, and DIFF is a comparator for comparing an output voltage $V_{SA}$ of the sense amplifier circuit and an output voltage $V_{REF}$ of the reference circuit and amplifying a difference therebetween. The output $D_o$ of the DIFF is transferred to an output buffer circuit (not shown). Each of the memory cells off the EEPROM consists of two transistors connected in series and, for example, a memory cell $M_{11}$ consists of a selecting cell $M_{S11}$ and a memorizing $M_{M11}$. Each of other memory cells $M_{n1}$, $M_{1m}$, $M_{nm}$ likewise consists of such a selecting cell and such a memorizing cell connected in series. The selecting cells $M_{S11}$, $M_{Sn1}$, $M_{S1m}$, $M_{Snm}$ are N-channel enhancement type MOSFETs (hereinafter referred to as "NE-MOSFET") and the memorizing cells $M_{M11}$, $M_{Mn1}$, $M_{M1m}$, $M_{Mnm}$ are MOSFETs having floating gates wherein actual writing-in and erasing of data are effected.

$Q_{Y1}, \ldots, Q_{Ym}$ are NE-MOSFETs for selecting Y-addresses of the memory cells, $Q_{Y1B}, \ldots, Q_{YmB}$ are NE-MOSFETs for selecting Y-addresses of the byte, $Q_{B11}, \ldots, Q_{Bn1}, \ldots, Q_{B1m}, \ldots, Q_{Bnm}$ are NE-MOSFETs for selecting X-addresses of the byte. EEPROM is shown by a portion marked as MX in FIG. 7 and if the EEPROM is to be of an 8-bit output in an actual configuration there will be eight of these but such illustration is omitted.

To simplify the explanation herein, it is assumed that the threshold values of the respective NE-MOSFETs are the same and $V_{TN}$ in all. FIG. 8 diagrammatically shows a prior art sense amplifier circuit. The portion represented by MX is the same as that shown in FIG. 7 and the explanation therefor is omitted. $Q_{S1}$ is an N-channel non-doped MOSFET (hereinafter referred to as "NO-MOSFET") having its gate and its drain commonly connected to the power source CC and its source connected to a node SA. $Q_{S2}$ is an NE-MOSFET having its drain connected to the node SA, its gate connected to an output (node SI) of a feedback inverter IV formed by transistors $Q_{S4}$ through $Q_{S7}$ and its source connected to a node SC. $Q_{S3}$ is an NE-MOSFET for pre-charging having its drain connected to the power source CC, its gate connected to the node SI, and its source connected to the node SA. $Q_{S4}$ is a P-channel enhancement type MOSFET (hereinafter referred to as "PE-MOSFET") having its source connected to the power source CC, its gate connected to a signal line $\overline{RD}$ which turns to "L" during the read-out mode. $Q_{S5}$ is a PE-MOSFET having its source connected to a drain of $Q_{S4}$, its gate grounded and its drain connected to the node SI. $Q_{S6}$ is an NE-MOSFET having its drain connected to the node SI, its gate connected to the node SC, and its source grounded. $Q_{S7}$ is an NE-MOSFET connected in parallel to $Q_{S6}$ and having its gate connected to the signal line $\overline{RD}$. $SD_1, \ldots, SD_m$ form respective digit lines to which, in the case of a large capacity or large scale EEPROM, a capacitance as large as several picofarads is applied.

The feedback inverter IV is generally designed to have a high gain so that it can amplify at a high speed a voltage change in the digit line which varies according to the memorized content in a selected memory cell. The operation of the sense amplifier circuit shown in FIG. 8 is briefly explained. To simplify the explanation, it is assumed that each of the MOSFETs in the circuit represented by SENSE has a gate-width/gate-length (hereinafter referred to as "W/L") as given hereunder.

(1) W/L of $Q_{S1}$ is so designed that this W/L balances with a current IM which flows in a memorizing cell storing "0". It is so designed that when IM=20 μA the voltage at the node SA becomes 8.25 V at the power supply voltage ($V_{cc}$) of 5 V.

(2) W/L of each of $Q_{S2}$ and $Q_{S3}$ is so designed that this W/L is sufficiently large as compared with that of $Q_{S1}$.

(3) W/L of each of $Q_{S4}$, $Q_{S5}$, $Q_{S6}$ and $Q_7$ is so designed that the feedback inverter IV has a high gain.

Consequently, it is assumed that W/L of the transistors involved is designed as, for example, $Q_{S1}=5/17.5$, $Q_{S2}=20/1.4$, $Q_{S3}=20/1.4$, $Q_{S4}=10/1.8$, $Q_{S5}=5/2$, $Q_{S6}=50/2$ and $Q_{S7}=10/1.4$, respectively.

It is also assumed here that $M_{M11}$ is storing "1" (erased state) so that, even if this $M_{M11}$ is selected and a read-out voltage $V_R$ is applied to the gate thereof, $M_{M11}$ becomes non-conductive. Further, it is assumed that $M_{Mn1}$ and $M_{M1m}$ are storing "0" (written-in state) so that, when $M_{Mn1}$ or $M_{M1m}$ is selected and the read-out voltage $V_R$ is applied to the gate thereof, $M_{MMn1}$ or $M_{M1m}$ becomes conductive thereby allowing the current IM to -Flow therein.

[1] The state under which X-address line is changed and the memorizing cell $M_{Mn1}$ is selected:

When $Y_1$ is "H", $X_1$ turns from "H" to "L" and $X_n$ turns from "L" to "H", the memorizing cell $M_{n1}$ is selected. Under this state, $Q_{Y1}$ becomes conductive and the digit line $SD_1$ is coupled to the input (the node SC) of the sense amplifier circuit SENSE. Since both the $Q_{Y1B}$ and $Q_{Bn1}$ become conductive, the read-out voltage $V_R$ is applied to the gate of $M_{Mn1}$. As $M_{Mn1}$ is storing "0", the current IM flows in the memory cell $M_{n1}$ whereby the voltage of the digit line $SD_1$ slightly drops. Then, this voltage change in the digit line $SD_1$ is transmitted to the node SC and the voltage at the output node SI of the feedback inverter IV rises, so that $Q_{S2}$ becomes conductive and that the current IM flows also therein. Under this state, the voltage at the node SA drops and, as explained above, the voltage at the node SA balances at 3.25 V when the power supply voltage $V_{cc}=5$ V. In the following consideration, it is assumed that the voltage at the node SA when the memorizing cell storing "0" is selected is $V_{SA(on)}$. Further, it is assumed that the balanced voltage at the node (digit line)

SD₁ under this state is $V_{SD1(on)}$. The value of the $V_{SA(on)}$ is generally shown by the following expression (1):

$$V_{SA(on)} = V_{cc} - \alpha \quad \alpha > V_{TO} \tag{1}$$

($V_{TO}$ is a threshold voltage of $Q_{S1}$ and $\alpha$ is a voltage difference between the gate and the source of the transistor $Q_{S1}$ to cause the current IM to flow).

Since the output voltage $V_{REF}$ of the reference circuit REF is, as shown in the expression (2), set higher than $V_{SA(on)}$, "L" is outputted at an output $D_o$ of the comparator DIFF shown in FIG. 7.

$$V_{REF} > V_{SA(on)} + \alpha \tag{2}$$

($\alpha$ is the minimum voltage difference which the comparator DIFF can detect.)

[2] The state under which X-address line is changed and the memory cell $M_{M11}$ is selected:

When $Y_1$ is "H", $X_n$ turns from "H" to "L" and $X_1$ turns from "L" to "H", the memory cell $M_{11}$ is selected. Under this state, $Q_{Y1}$, $Q_{Y1B}$ and $Q_{S11}$ become conductive and the node SD₁ is coupled to the node SC, and the read-out voltage $V_R$ is applied to the gate of $M_{M11}$. As $M_{11}$ is storing "1", $M_{M11}$ becomes non-conductive. Thus, the digit line SD₁ and the node SC are charged through $Q_{S1}$, $Q_{S2}$ and the voltages thereof rise slightly from the equilibrium value $V_{SD1(on)}$ of the previous cycle, while the voltage at the node SI drops thereby causing $Q_{S2}$ to become non-conductive. As a result, the node SA is separated from the node SC and the node SA is charged by $Q_{S1}$ and balanced at the $V_{SA(off)}$ as expressed by the equation (3). Here, the digit line SD₁ and the node SC balance at the equilibrium value $V_{SD1(off)}$.

$$V_{SA(off)} = V_{cc} - V_{TO} \tag{3}$$

Under this state, assuming that $V_{TO}$ is 0.5 V and $V_{cc}$ is 5 V, the value of $V_{SA(off)}$ is 4.5 V.

Since the reference voltage $V_{REF}$ is, as shown in the following expression (4), set lower than $V_{SA(off)}$, "H" is outputted from the output $D_o$ of the comparator DIFF shown in FIG. 7.

$$V_{REF} < V_{SA(off)} - \alpha \tag{4}$$

Assuming that the value of $V_{REF}$ is set to a value satisfying the above expressions (2) and (4) and, in this example, is set to $\alpha = 0.2$ V, the reference circuit REF is designed such that, for example, $V_{REF} = 3.85$ V.

[3] The state under which Y-address line is changed and the memorizing cell $M_{M11}$ is selected:

Next, explained with reference to FIGS. 7 through 9 is the operation which takes place under the state wherein the memorizing cell $M_{11}$ is selected with $Y_1$ turning from "L" to "H" and $Y_m$ turning "H" to "L", which state is changed from the state wherein the memorizing cell $M_{1m}$ is selected with $Y_1$ being "L", $Y_m$ being "H", $X_m$ being "H" and $X_m$ being "L", when Y-address lines are switched.

FIG. 9 shows voltage waveforms at the various essential nodes in the case where the power supply voltage $V_{cc}$ is 5 V. The symbols used in the graph correspond to the respective nodes shown in FIG. 8. The operation which takes place when the digit line SD₁ is rendered to be the ground potential due to such as Junction leakage determines a worst value of the speed of the sense amplifier circuit. The operation under such state will be explained hereunder.

As explained under [2] above, $M_{M11}$ is storing "1" and thus $M_{M11}$ becomes non-conductive. Therefore, simultaneously with the switching of the Y-address lines, the charge is supplied from the node SC to the digit line SD₁ of the ground potential for charging. Consequently, the potential at the node SC drops slightly. As explained above, since the feedback inverter has a high gain for a high speed operation, the voltage at the node SI rapidly rises when the potential at the node SC turns lower than the equilibrium voltage $V_{SD1(on)}$. For this reason, $Q_{S2}$ becomes conductive and the voltage at the node SA rapidly drops. The voltage at this point is, as shown in FIG. 9, lower than $V_{SA(on)}$ rendering the node SA to be in an excessively discharged state. Here, since the gate-source voltage differences of $Q_{S3}$ and $Q_{S1}$ become larger than $V_{TN}$ and $V_{TO}$, respectively, both $Q_{S3}$ and $Q_{S1}$ become conductive thereby causing the digit line SD₁ and the node SC to be charged through $Q_{S2}$. As the node SC and the digit line SD₁ are charged, the voltage at the node SI becomes lower and, when the value of the voltage difference ($V_{SI} - V_{SA}$) between the node SI and the node SA becomes $V_{TN}$, $Q_{S3}$ turns to non-conductive and, thereafter, the charging is made only by $Q_{S1}$. The node SC and the digit line SD₁ are further charged and the voltage at the node SI further drops and when the time reaches t21, $Q_{S2}$ becomes non-conductive, so that the node SA is released from the excessively discharged state and is quickly charged by $Q_{S1}$. As explained before under [2] above, the node SA rises up to a value as shown in the equation (3) and balances at this value, whereby "H" is outputted from the output $D_o$ of the comparator DIFF shown in FIG. 7. The access time under this state is represented by $t_{sense2}$ in FIG. 9.

In the conventional EEPROM which operates as explained above, as there are instances where a non-selected digit line becomes 0 V due to such causes as a junction leakage, when Y-address is switched and the memorizing cell storing "1" is selected, it is necessary for the digit line to be charged from 0 V up to the equilibrium value $V_{SD1(off)}$. The time required for this time $t_{ch}$ may be expressed, on the basis that the difference in the voltage to be charged is $\Delta V$, the capacitance of the digit line is $C_{digit}$, the average load current to charge the digit line is $I_{LOAD}$ (the value of $I_{LOAD}$ being determined by W/L of $Q_{S1}$ through $Q_{S6}$), by the following equation (5):

$$t_{ch} = (C_{digit} \Delta V)/I_{LOAD} \tag{5}$$

In this conventional example, the value of $V_{SD1(off)}$ is set slightly higher than the logical threshold value of IV so that, when $V_{SD1(off)} = 1.1$ V, the difference in the voltage to be charged will be $\Delta V = V_{SD1(off)} = 1.1$ V. Further, $C_{digit}$ is 2 pF and $I_{LOAD}$ is 100 μA in this conventional example, the time $t_{ch}$ required for the necessary charging will be $t_{ch} = 22$ nS. In an EEPROM, a memory cell is formed by two transistors per cell, so that the current IM which flows in the memorizing cell is generally as small as about 20 μA. Thus, the value of $I_{LOAD}$ which is set to be balanced with the current IM cannot be set to a large value. As the circuit capacity or circuit scale is made larger, the larger the value of $C_{digit}$ becomes and, since 1M is substantially determined by W/L of each of the selecting cells and the memorizing cells, it is not possible to achieve the desired improvement by an increase in the circuit scale. As the capacity or scale is increased, there is a trend that the value $t_{ch}$ shown by the equation (5) increases accordingly.

Under the state in which X-address line is changed, since the voltage at the digit lines is always biased in advance to the equilibrium value (in this example, to the vicinity of 1 V), even if tile capacity is increased and the value of $C_{digit}$ becomes large, it is possible to have the EEPROM operate at a high speed by making the time constant small with an arrangement, for example, wherein the word lines $W_1, \ldots, W_n$ shown in FIG. 8 are formed by low resistance materials.

On the other hand, the speed of the sense amplifier in the state under which Y-address line is changed and the memorizing cell storing "1" is selected is determined by the time $t_{ch}$ required for charging lip the digit line from 0 V to the equilibrium value, so that it is not possible to increase the speed by any decrease in the time constant for the word lines. Therefore, as the circuit capacity or scale becomes larger, the greater the speed of the EEPROM is restricted by the operation speed of the sense amplifier in which the memorizing cell storing "1" is selected when Y-address line is changed. Thus, in the conventional EEPROM as shown in FIG. 8, it is not possible to achieve a high speed operation if such EEPROM has a large capacity or scale, which is a disadvantage.

In the conventional EEPROM explained above, since there is a state wherein the voltage of non-selected digit line is 0 V thereby necessitating to charge such digit line up to the equilibrium value from 0 V when the Y-address line is changed, so that the greater the capacity or scale is increased the slower the speed for charging becomes, which means that the operating speed of such EEPROM is limited by the time in which the digit line is charged up to the equilibrium value from 0 V. Therefore, a problem therein is that it is not possible to have both the circuit capacity or scale and the speed increased in such conventional EEPROM.

SUMMARY OF THE INVENTION

It is, therefore, an object of the invention to overcome the problems existing in the conventional semiconductor integrated circuit device or EPROM and to provide an improved semiconductor integrated circuit device.

One aspect of the present invention includes a semiconductor integrated circuit device having a plurality of digit lines, and a plurality of memory elements connected in parallel with the digit lines. A sense amplifier circuit is electrically coupled with a selected one of the digit lines for amplifying data on the digit line and outputting the data after amplification. A digit line bias mechanism biases all of the digit lines to a predetermined level during a read-out mode. The digit line bias mechanism includes a bias voltage generating circuit for outputting an output voltage of the predetermined level in accordance with a control signal during the read-out mode. The bias voltage generating circuit includes an output node, a first enhancement MOSFET of a first conductivity type having a drain, a source connected to a power source, and a gate receiving the control signal, a second depletion MOSFET of a second conductivity type having a gate and a source commonly connected to the output node, and a drain connected to the drain of the first enhancement MOSFET, a third enhancement MOSFET of the second conductivity type including a source, and having a drain and a gate commonly connected to the output node, a fourth enhancement MOSFET of the second conductivity type having a source coupled to a ground, and a drain and a gate connected to the source of the third enhancement MOSFET, and a fifth enhancement MOSFET of the second conductivity type having a drain connected to the output node, a gate receiving the control signal and a source coupled to the ground. The bias voltage generating circuit includes a digit line biasing circuit disposed between the power source and each of the digit lines. The digit line biasing circuit conducts responsive to the output voltage from the output node of the bias voltage generating circuit and biases all of the digit lines to the predetermined level.

BRIEF DESCRIPTION OF THE DRAWINGS

The above and other objects, features and advantages of the present invention will be apparent from the following description of preferred embodiments of the invention, with reference to the accompanying drawings, in which:

FIG. 3 is a circuit diagram showing a lead circuit for digit line in the embodiments according to the present invention;

FIG. 4 is a graph showing input and output characteristics of a feedback inverter in the embodiments according to the present invention;

PREFERRED EMBODIMENTS OF THE INVENTION

Throughout the following explanation, similar reference symbols or numerals refer to the same or similar elements in all the figures of the drawings.

Figure 1:
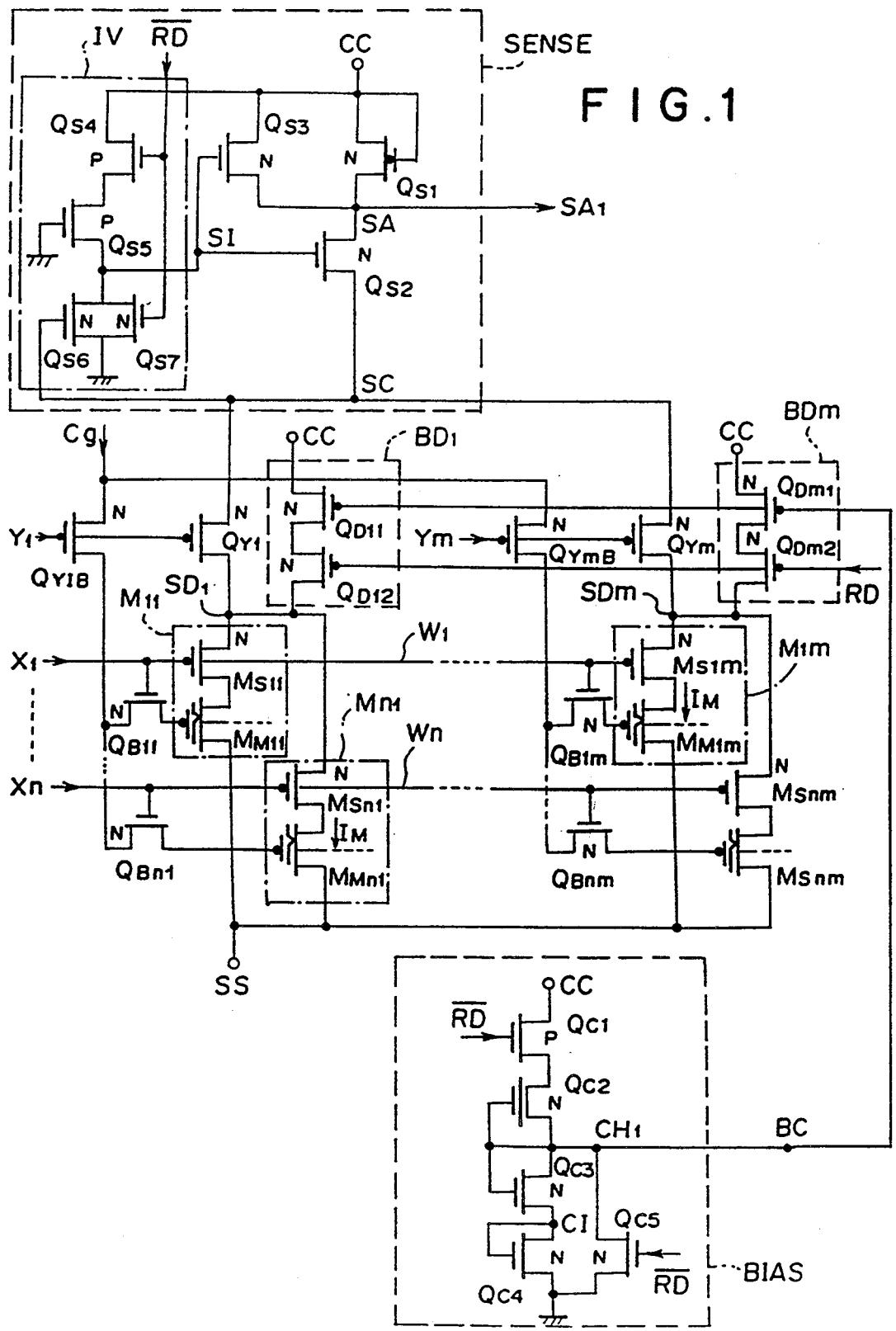
FIG. 1 is a circuit diagram showing a semiconductor circuit device of a first embodiment according to the present invention.

FIG. 1 is a circuit diagram showing an EEPROM of a first embodiment according to the present invention.

Figure 8:
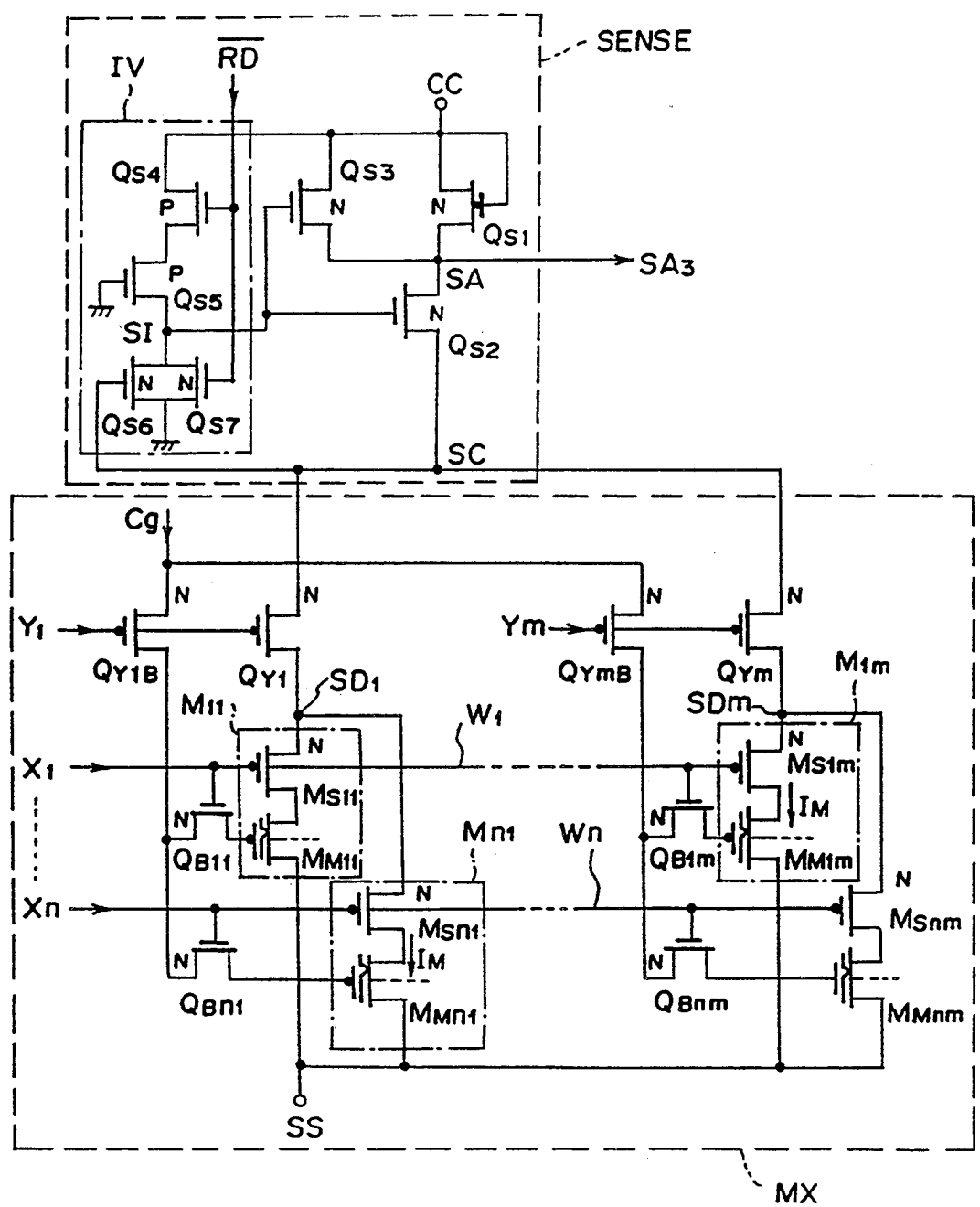
FIG. 8 is a detailed circuit diagram showing a sense amplifier shown in FIG. 7.

The like elements as those in the conventional arrangement shown in FIG. 8 are given the like numerals or symbols and the explanation therefor has been omitted herein.

BIAS is a bias voltage generating circuit for generating a predetermined voltage $V_{BC}$ at an output node BC during the read-out mode. $\overline{RD}$ is a signal line to which "L" is applied during the read-out mode and "H" is applied under other modes. $Q_{C1}$ is a PE-MOSFET having its source connected to the power source CC and its gate connected to the signal line $\overline{RD}$. $Q_{C2}$ is an N-channel depletion type MOSFET (hereinafter referred to as "ND-MOSFET") having its drain connected to the drain of $Q_{C1}$ and its gate and its source commonly connected to a node $CH_1$. $Q_{C3}$ is an NE-MOSFET having its drain and its gate connected together. $Q_{C4}$ is an NE-MOSFET having its drain and its gate connected to the source of $Q_{C3}$ and its source grounded. $Q_{C5}$ is an NE-MOSFET having its drain connected to the node $CH_1$, its gate connected to the signal line $\overline{RD}$ and its source connected to the ground. The node $CH_1$ is connected to the output node BC. $BD_1, \ldots, BD_m$ are digit line bias circuits which apply bias voltage to the digit lines $SD_1, \ldots, SD_m$, respectively, during the read-out mode. $Q_{D11}, \ldots, Q_{Dm1}$ are NE-MOSFETs each having its drain connected to the power source CC and its gate connected to the output node BC of the BIAS. $Q_{D12}, \ldots, Q_{Dm2}$ are NE-MOSFETs each having a high breakdown-voltage characteristic and each having its drain connected to a source of each of $Q_{D11}, \ldots, Q_{Dm1}$, its gate connected to the signal line RD which becomes "H" only during the read-out mode, its source connected to each of the digit lines $SD_1, \ldots, SD_m$. The threshold voltage of each of the ND-MOSFETs for purposes of the following explanation is assumed to be about $-2$ V.

In the BIAS circuit, W/L of $Q_{C3}$ and $Q_{C4}$ is designed sufficiently large as compared with W/L of $Q_{C2}$. Thus, during the read-out mode, the voltage of the output node BC is set to about $2V_{TN}$. Other than during the read-out mode, $Q_{C1}$ is non-conductive while $Q_{C5}$ is conductive and, thus, the voltage at the output BC is set to 0 V. As to $B_{D1}$ of the digit line bias circuits, during the read-out mode, $2V_{TN}$ is applied to $Q_{D11}$ and since $Q_{D12}$ is in a conductive state, the digit line $SD_1$ is charged to about $V_{TN}$ by $Q_{D11}$ and $Q_{D12}$. Needless to say that W/L of $Q_{D11}$ is designed such that the current driving capability thereof is sufficiently larger than the current IM. The same applies also to other digit lines. In the present embodiment, irrespective of whether the memory cell is selected or non-selected during the read-out mode, all the digit lines are charged up to the voltage at which $Q_{D11}, \ldots, Q_{Dm1}$ are cut off, that is, up to $V_{TN}$. Since, other than during the read-out mode, the voltage of the BIAS output node BC is rendered to be 0 V, $Q_{D11}, \ldots, Q_{Dm1}$ become non-conductive and thus the power source CC and the digit lines are electrically disconnected or separated with each other.

The reason for the provision of $Q_{D12}, \ldots, Q_{Dm2}$ is that, during the write-in mode, a high voltage is applied to the digit lines by a write-in circuit (not shown) and, under this state, it is due to $Q_{D12}, \ldots, Q_{Dm2}$ that NE-MOSFETs, $Q_{D11}, \ldots, Q_{Dm1}$ which have a normal breakdown-voltage characteristic, are disconnected or separated from the digit lines.

With reference to FIG. 1, FIG. 3 and FIG. 4, explanation is made on ways for setting the output voltage $V_{BC}$ of the bias voltage generating circuit BIAS in this embodiment. FIG. 3 shows a load circuitry for the digit line $SD_1$ which is shown in FIG. 1. The load circuitry is shown with separation being made between a first load circuit $LOAD_1$ formed by $Q_{S1}-Q_{S6}$ and $Q_{Y1}$ and a second load circuit $BD_1$ formed by $Q_{D11}$ and $Q_{D12}$. Load currents supplied respectively by $LOAD_1$ and $BD_1$ are represented by $I_{L2}$ and $I_{L1}$. INV shown in FIG. 4 shows input and output characteristics of the feedback inverter IV formed by $Q_{S4}-Q_{S6}$. Point P is the equilibrium point for the node $SD_1$ and the node SI when the memorizing cell storing "0" is selected and Point Q is the equilibrium point for the node $SD_1$ and the node SI when the memorizing cell storing "1" is selected.

[1] Switching of X-address line on the selected digit line:

When the X-address is changed on the selected digit line, the voltages at the node $SD_1$ and the node SI swing between point P and point Q. If the value of the output voltage $V_{BC}$ of BIAS is set so that, under the state wherein no $LOAD_1$ is present, the bias voltage of the node $SD_1$ becomes lower than the equilibrium voltage $V_{SD1(on)}$ of the node $SD_1$ ($V_P$ in the present embodiment) when a memorizing cell storing "0" is selected, $BD_1$ does not contribute to the operation so that $I_{L1}$ becomes "0" and the load current at the node $SD_1$ is determined by $I_{L2}$, thereby allowing the sense amplifier circuit to operate exactly the same as the conventional device described above.

[2] In non-selected lines:

In the non-selected digit line, $Y_1$ turns to "L" and $I_{L2}$ becomes 0. Consequently, the node $SD_1$ is charged up to the value which is determined by $V_{BC}$.

[3] The case where Y-address is changed and a digit line changes from the non-selected state to the selected state is explained hereunder.

Under the non-selected state, as explained under [2] above, the digit line $SD_1$ has been charged up to $V_P$. Here, when Y-address is changed and $Y_1$ changes from "L" to "H", the current $I_{L2}$ flows and the digit line $SD_1$ is charged by $Q_{S1}, Q_{S2}$ as explained in relation to the conventional example. If "1" is stored in the selected memorizing cell, the voltage of the digit line $SD_1$ balances with $V_{SD1(off)}$ at point Q. If "0" is stored in the selected memory cell, the voltage of the digit line $SD_1$ balances with point P.

As explained above, according to the present invention, the bias voltage $V_P$ supplied to the digit lines below $V_{SD1(on)}$ but, for purposes of speeding up, the output voltage $V_{BC}$ of the bias circuit BIAS is set near $V_{SD1(on)}$. In the present example, the feedback inverter IV has been designed to have a high gain so that, in the case of $V_{TN}=0.85$ V, the logical threshold value $V_I$ of the feedback inverter IV under $V_{cc}=5$ V is $V_I=0.95$ V and $V_{SD1(on)}=1.05$ V. Thus, as in the present example, setting of the value of $V_{BC}$ to $2V_{TN}$ results in $V_P=V_{TN}=0.85$ V and $V_P$ being lower than $V_{SD1(on)}$ and this enables to make the setting to a neighborhood of $V_{SD1(on)}$.

Figure 5:
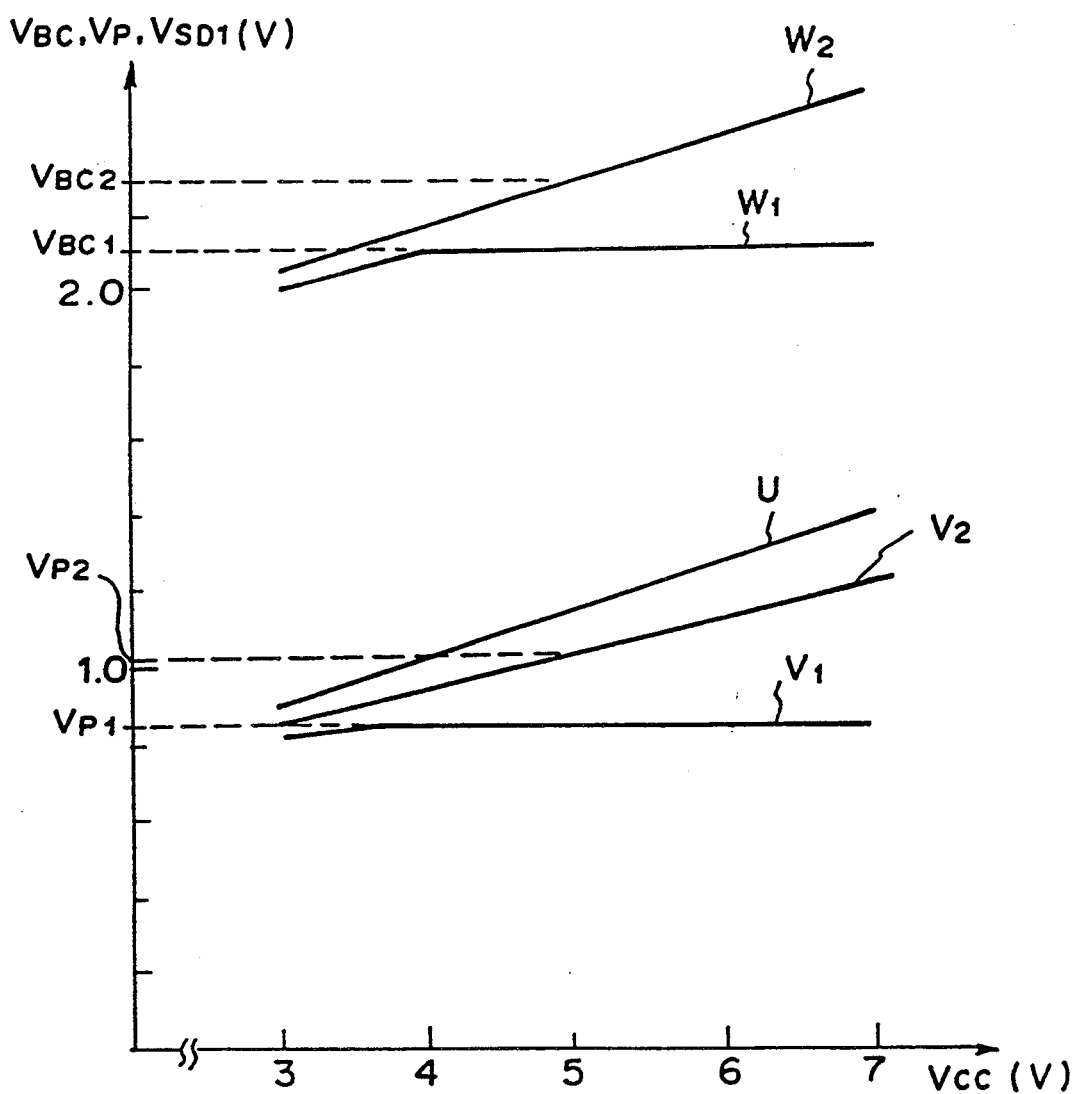
FIG. 5 is a graph showing changes in output voltages of a bias voltage generating circuit, bias voltages of digit lines and equilibrium voltages of digit lines in the embodiments.

FIG. 5 shows, in respect of the first embodiment, changes in output voltages (Curve $W_1$) of output BC of the bias circuit BIAS, changes in bias voltage $V_P$ (Curve $V_1$) of the digit line and changes in voltages (Curve U) of $V_{SD1(on)}$ which develop in accordance with the changes in the power supply voltages $V_{cc}$. $V_{BC1}$ and $V_{P1}$ respectively represent the output voltage of BIAS and the bias voltage of the digit line $SD_1$ under the power supply voltage $V_{cc}=5$ V. As readily appreciated from the curves $W_1$, $V_1$, there are almost no changes in the values of the voltage at the output BC and the bias voltage $V_P$ at the digit line irrespective of changes in $V_{cc}$. This is due to the reason that, in the BIAS circuit, the transistor $Q_{C2}$ is operating under a saturated state and thus the current driving capability of $Q_{C2}$ undergoes almost no changes despite changes in $V_{cc}$.

The characteristics of the value of $V_{SD1(on)}$ are that, in the feedback inverter IV of FIG. 1, as the $V_{cc}$ becomes higher, the logic threshold value $V_I$ of IV also becomes higher and, as seen in FIG. 5, the value of $V_{SD1(on)}$ becomes higher in accordance with the increase in $V_{cc}$. In the case of $V_{TN}=0.85$ V, the value of $V_{BC1}$ is higher than $2 \cdot V_{TN}=1.7$ V and this is because, due to the substrate bias effect for $Q_{C3}$, the threshold value of $Q_{C3}$ has increased by $\Delta V$ from $V_{TN}$.

As it can be easily understood by comparing the curve $\underline{U}$ and the curve $V_1$, the bias voltage $V_P$ of the digit line is satisfactorily below $V_{SD1(on)}$ in a wide range of $V_{cc}$. Thus, the circuit according to the present invention as shown in FIG. 1 satisfactorily operates in a wide range of the power supply voltage $V_{cc}$ as in the prior art arrangement explained above. It is also appreciated that as the value of $V_{cc}$ is lower the voltage difference between $V_P$ and $V_{SD1(on)}$ is smaller. Since the value of $I_{LOAD}$ in the equation (5) generally becomes smaller as $V_{cc}$ becomes lower, it can be said that the improvement in speeding up of the circuit at the time of Y-address switching achieved by a pre-set biasing for non-selected digit lines is greater as $V_{cc}$ is lower.

Next, the operation of the circuit of the first embodiment is explained with reference to FIGS. 1 and 6.

[1] Operation when X-address is changed:

As explained above, when X-address line is switched, the digit line biasing circuit $BD_1$ does not contribute to the operation. This means that the operation is the same as that in the prior art arrangement explained and such explanation is omitted herein.

Figure 6:
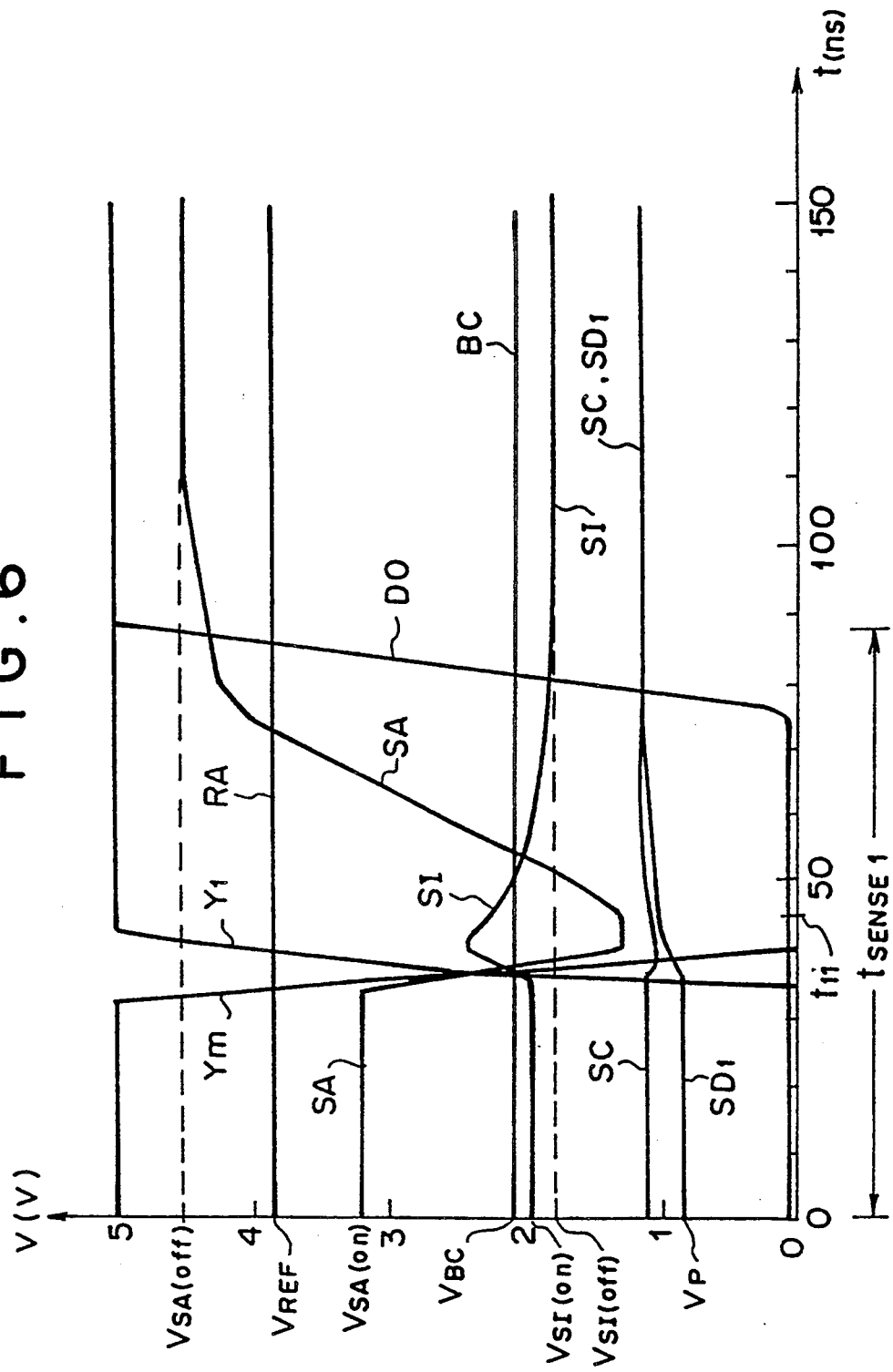
FIG. 6 is a graph showing voltage waveforms for illustrating the operation of the semiconductor device of the first embodiment.
Figure 7:
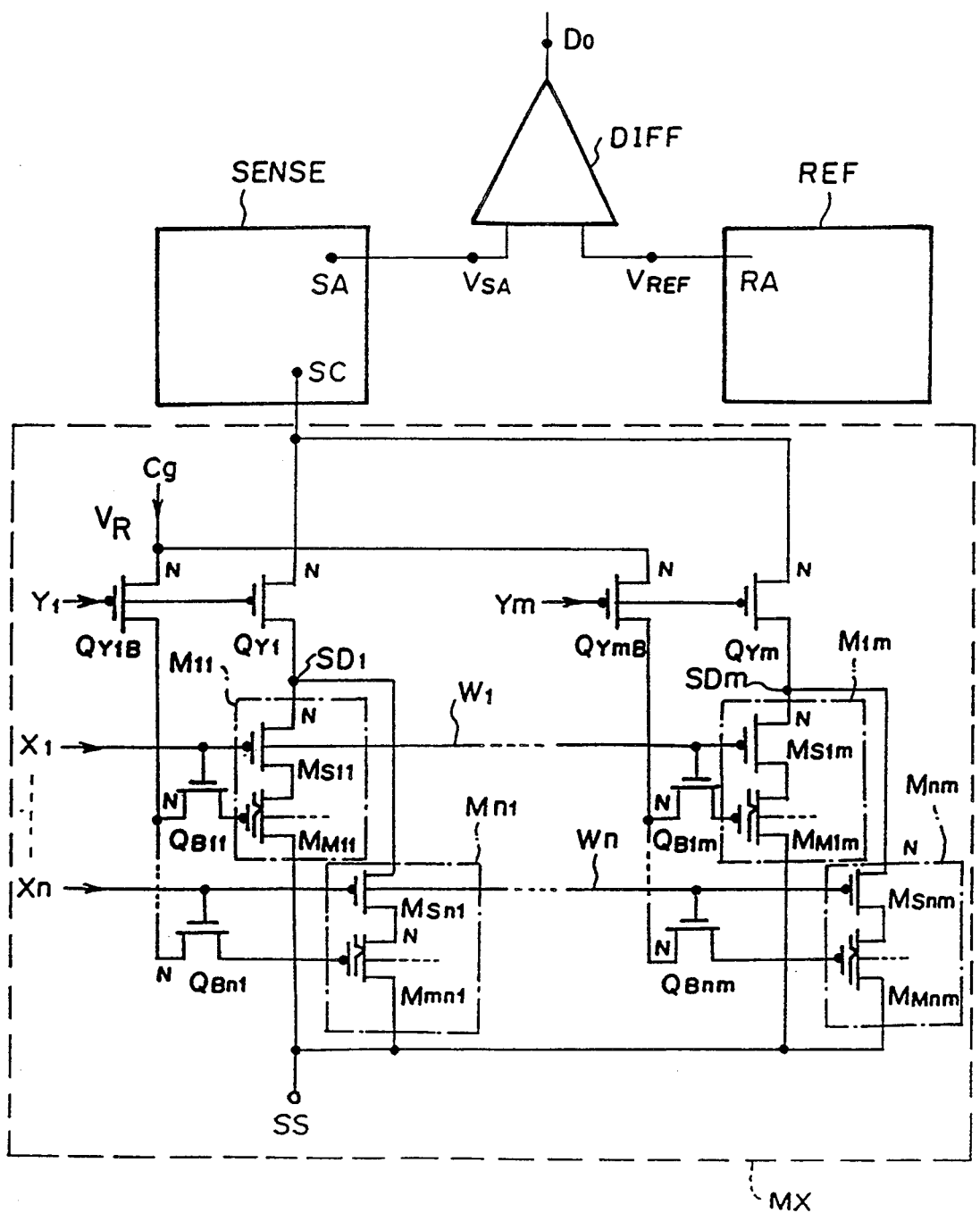
FIG. 7 is a circuit diagram showing a prior art semiconductor circuit device.
Figure 9:
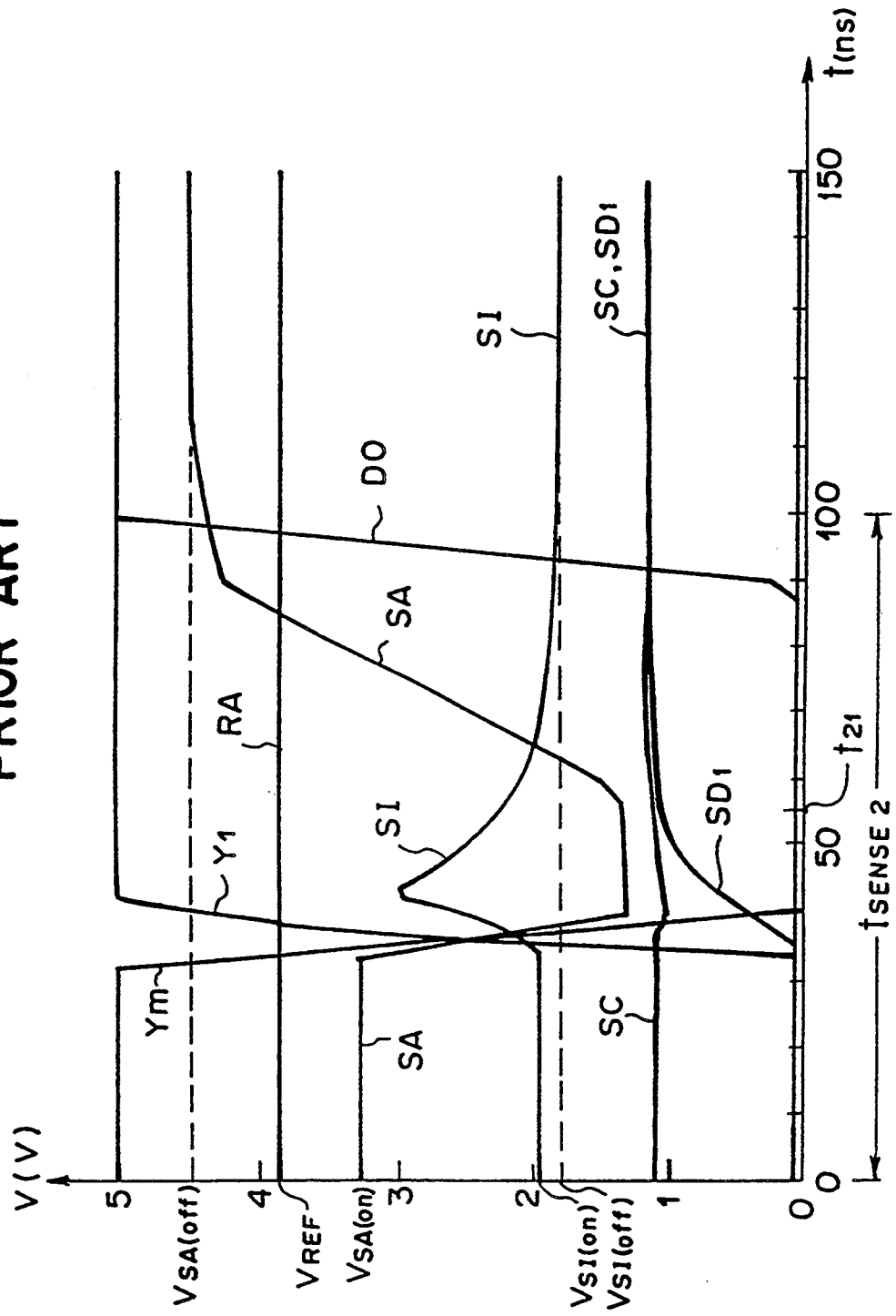
FIG. 9 is a graph showing voltage waveforms for illustrating tile operation of tile prior art semiconductor circuit device.

[2] Operation when Y-address is changed and the memorizing cell $M_{M11}$ is selected:

FIG. 6 shows voltage waveforms at the respective nodes when Y-address is changed and the memorizing cell $M_{M11}$ is selected. In FIG. 6 (in the case of $V_{cc}=5$ V), BC represents output voltage waveform of BIAS and $V_P$ represents the bias voltage in the state wherein the non-selected digit line is biased in advance. When $X_1$ is "H", $X_m$ is "L", $Y_1$ turns from "L" to "H" and $Y_m$ turns from "H" to "L", the memory cell $M_{11}$ is selected. Under this state, the charge is supplied to the node $SD_1$ from the node SC so as to charge the digit line $SD_1$ whereby the voltage at the node SC is slightly decreased, the voltage at the node SI is slightly increased, $Q_{S2}$ becomes conductive and the voltage at the node SA rapidly drops and, as is the case in the prior art explained, the node SA turns to an excessively discharged state. Then, the node SC and the digit line $SD_1$ are charged through $Q_{S2}$, the voltages at the node SC and the digit line $SD_1$ increase and the voltage at the node SI decreases. When the voltage difference developed between the node SI and the node SC reaches $V_{TN}$ (time t11), $Q_{S2}$ becomes non-conductive, so that the node SA is electrically separated from the node SC and the voltage at the node SA rapidly goes up. As can be understood from the comparison between FIG. 6 and FIG. 9, since the non-selected digit lines are charged up to $V_P$ in advance, the time which takes for charging the digit line $SD_1$ up to the equilibrium value $V_{SD1(off)}$ is shorter than in the prior art arrangement explained.

For example, as in the prior art example, assuming that $V_{SD1(off)}=1.1$ V and the bias voltage is set to $V_P=0.85$ V, it follows that $\Delta V=1.1$ V $-0.85$ V $=0.25$ V and, as in the prior art example, if $C_{digit}=2$ pF and $I_{LOAD}=100$ μA, $t_{ch}=8$ nS may be obtained from the equation (5) so that, as compared with the prior art example, the speed-up achieved is by 14 nS.

Therefore, in the present embodiment, since the period in which the voltage at the node SA becomes lower than $V_{SA(on)}$ and the state of excessively discharged continues is shorter than in the prior art example, the access time ($t_{sense1}$) in which a data is outputted to the output $D_o$ of the comparator is faster than the access time ($t_{sense2}$) of the prior art example.

Figure 2:
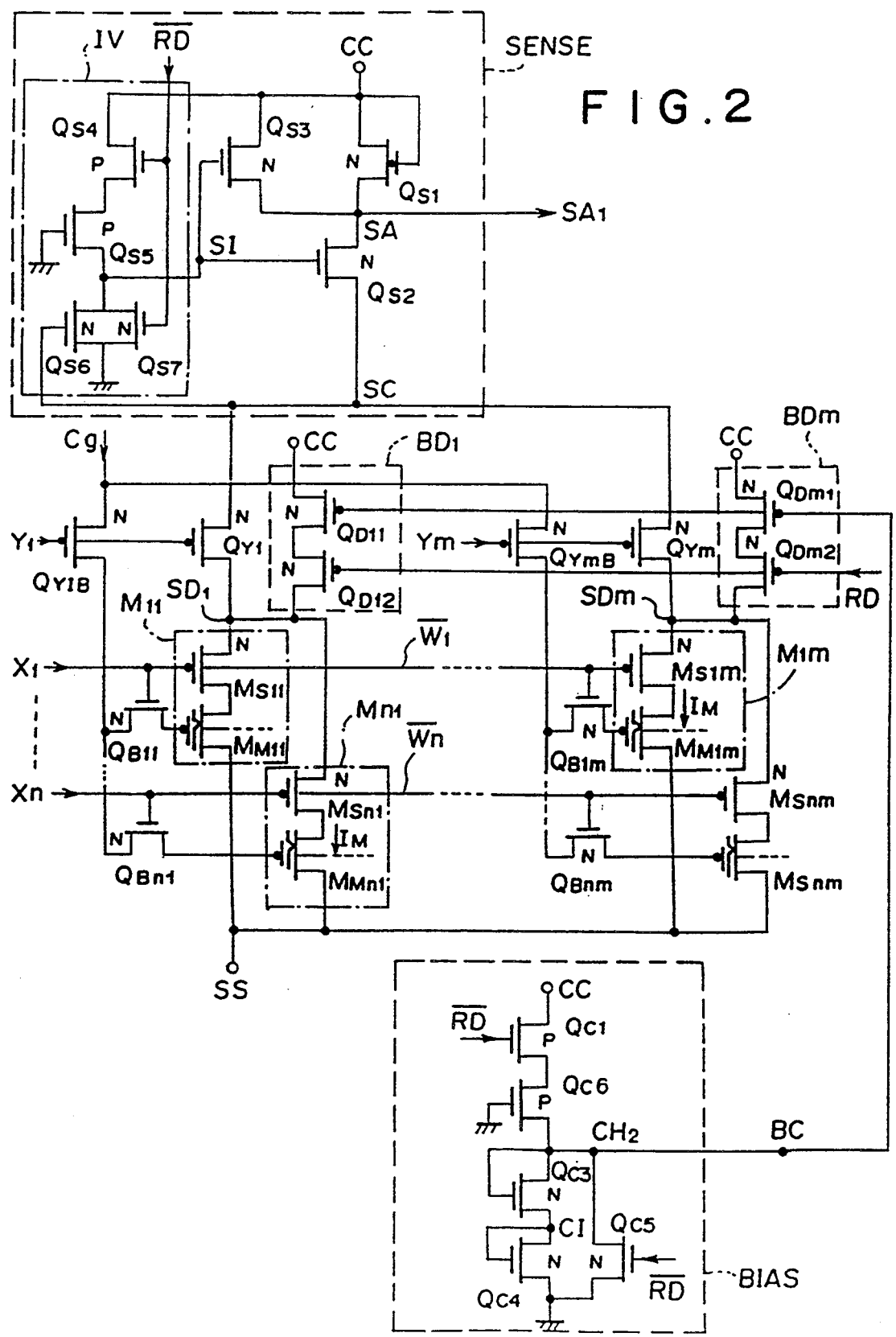
FIG. 2 is a circuit diagram showing a semiconductor circuit device of a second embodiment according to the present invention.

FIG. 2 shows a second embodiment according to the present invention. The same reference numerals have been assigned to the same or like elements shown in FIG. 1. BIAS In the second embodiment shown in FIG. 2 is so arranged that the load current is determined by the PE-MOSFET $Q_{C6}$ whereas, in the first embodiment, this is determined by the ND-MOSFET $Q_{C2}$. $W_2$ and $V_2$ in FIG. 5 show respectively $V_{cc}$ dependency of the output $CH_2$ of BIAS and that of the bias voltage $V_P$ of the digit line $SD_1$ of the second embodiment. $V_{BC2}$ and $V_{P2}$ represent respectively the output voltage of the bias voltage generating circuit BIAS and the bias voltage For the digit line $SD_1$ when the power supply voltage $V_{cc}=5$ V. As can be appreciated by comparing $W_2$ and $W_1$, $V_2$ and $V_1$ with one another, in accordance with the increase in $V_{cc}$, there is an increase accordingly in the output voltage of the bias voltage generating circuit BIAS and in the bias voltage of digit line $SD_1$ in the second embodiment. This is because, in the second embodiment, $Q_{C6}$ is operating in a triode-state so that as the $V_{cc}$ increases the current driving capability of $Q_{C6}$ is increased accordingly. Comparison between the curve $\underline{U}$ and the curve $V_2$ shows that, in the second embodiment also, the bias voltage $V_P$ of the digit line is satisfactorily below $V_{SD1(on)}$ over a wide range of the power supply voltage $V_{cc}$. Thus, it can be appreciated that the second embodiment is also one which provides a satisfactory operation over a wide range of $V_{cc}$. There is a difference in operation in this second embodiment from that in the first embodiment only in the bias voltage for the non-selected digit lines. Since the operation in other respects is exactly the same as that in the First embodiment, the explanation therefor is not repeated here.

As explained above, in the second embodiment according to the present invention, the output voltage of BIAS has $V_{cc}$ dependency and, therefore, the voltage $V_P$ by which the non-selected digit lines are biased has $V_{cc}$ dependency. Thus, by appropriately designing the circuitry of BIAS. $BD_1, \ldots, BD_m$, it is possible to have the value of $V_P$ set to almost the same value as $V_{SD1(on)}$ in a wide range of $V_{cc}$ and this makes it possible to achieve a still further speed-up in the circuit operation over that in the first embodiment.

Although the foregoing explanation has been given based on an EEPROM as an example, it is to be noted that the same advantage may be enjoyed irrespective of whether the semiconductor device in which the invention is embodied is an EEPROM capable of electrically writing-in or a ROM exclusively for reading-out operation. The first and second embodiments deal with typical configurations of the bias voltage generating circuit but, of course, the invention is not limited to such circuit configurations. As long as the circuit configuration is that in which a predetermined constant voltage is outputted during the read-out mode, the present invention can be applied thereto effectively. Further, as $BD_1, \ldots, BD_m$ according to the present invention, there have been shown examples wherein $Q_{D11}$ and $Q_{D12}, \ldots, Q_{Dm1}$ and $Q_{Dm2}$ are respectively provided, but each of $Q_{D11}, \ldots, Q_{Dm1}$ may well be provided independently without $Q_{D12}, \ldots, Q_{Dm2}$.

In the EEPROM according to the present invention, the non-selected digit lines are biased to a predetermined voltage $V_P$ by the digit line biasing means during the read-out mode, which results in the following advantages:

(1) When Y-address is changed, the speed in which the selected digit line is charged to the equilibrium value $V_{SD1(on)}$ or $V_{SD1(off)}$ is faster than in the prior art example wherein the digit lines are at 0 V. Thus, the operation speed of the sense amplifier circuit then is faster than in the prior art example.

(2) Since the junction capacitance of the drain of each of the selecting cells $M_{S11}, \ldots, M_{Sn1}$ connected to the digit lines becomes smaller than in the prior art example, the operation of the sense amplifier circuit is generally speeded-up.

(3) With the bias voltage generating circuit BIAS and the digit line bias circuits $BD_1, \ldots, BD_m$ are so designed that the value of the bias voltage $V_P$ is close to $V_{SD1(on)}$, even when the circuit capacity or circuit scale becomes larger, it is possible to arrange that the operation speed under the state in which the memorizing cell storing "1" is selected when Y-address is changed be almost the same as the operation speed when X-address is switched. Therefore, the present invention may be effectively embodied in such EEPROM which is large in capacity or circuit scale and which requires high speed operation.

While the invention has been described in its preferred embodiments, it is to be understood that the words which have been used are words of description rather than imitation and that changes within the purview of the appended claims may be made without departing from the true scope and spirit of the invention in its broader aspects.

What is claimed is:

1. A semiconductor integrated circuit device comprising:
    a plurality of digit lines;
    a plurality of memory elements connected in parallel with said digit lines;
    a sense amplifier circuit electrically coupled with a selected one of said digit lines for amplifying data on said digit line and outputting said data after amplification; and
    a digit line bias means for biasing all of said digit lines to be a predetermined level during a read-out mode, said digit line bias means including:
    a bias voltage generating circuit for outputting an output voltage of said predetermined level in accordance with a control signal during the read-out mode, said bias voltage generating circuit including:
    an output node,
    a first enhancement MOSFET of a first conductivity type having a drain, a source connected to a power source, and a gate receiving said control signal,
    a second depletion MOSFET of a second conductivity type having a gate and a source commonly connected to said output node, and a drain connected to said drain of said first enhancement MOSFET,
    a third enhancement MOSFET of said second conductivity type including a source, and having a drain and a gate commonly connected to said output node,
    a fourth enhancement MOSFET of said second conductivity type having a source coupled to a ground, and a drain and a gate connected to said source of said third enhancement MOSFET, and
    a fifth enhancement MOSFET of said second conductivity type having a drain connected to said output node, a gate receiving said control signal and a source coupled to said ground, and
    a digit line biasing circuit disposed between said power source and each of said digit lines for being conductive responsive to said output voltage from said output node of said bias voltage generating circuit and for biasing all of said digit lines to said predetermined level.

2. The semiconductor integrated circuit device of claim 1 wherein said first conductivity is a P-channel and said second conductivity is an N-channel.

3. A semiconductor integrated circuit device comprising:
    a plurality of digit lines;
    a plurality of memory elements connected in parallel with said digit lines;
    a sense amplifier circuit electrically coupled with a selected one of said digit lines for amplifying data on said digit line and outputting said data after amplification; and
    a digit line bias means for biasing all of said digit lines to be a predetermined level during a read-out mode, said digit line bias means including:
    a bias voltage generating circuit for outputting an output voltage of said predetermined level in accordance with a control signal during the read-out mode, said bias voltage generating circuit including:
    an output node,
    a first enhancement MOSFET of a first conductivity type having a drain, a source connected to a power source, and a gate receiving said control signal,
    a second enhancement MOSFET of said first conductivity type having a source connected to said drain of said first enhancement MOSFET, a gate coupled to a ground and a drain connected to said output node,
    a third enhancement MOSFET of a second conductivity type having a drain and a gate commonly connected to said output node, and including a source,
    a fourth enhancement MOSFET of said second conductivity type including a source coupled to ground, and having a drain and a gate commonly connected to said source of said third enhancement MOSFET, and
    a fifth enhancement MOSFET of said second conductivity type having a drain connected to said output node, a gate connected to said control signal and a source grounded coupled to said ground, and
    a digit line biasing circuit disposed between said power source and each of said digit lines for being conductive responsive to said output voltage from said output node of said bias voltage generating circuit and for biasing all of said digit lines to said predetermined level.

4. The semiconductor integrated circuit device of claim 3 wherein said first conductivity type is a P-channel and said second conductivity is an N-channel.

5. A semiconductor integrated circuit device comprising:
    a plurality of digit lines;
    a plurality of memory elements connected in parallel with said digit lines;
    a sense amplifier circuit electrically coupled with a selected one of said digit lines for amplifying data on said digit line and outputting said data after amplification;

a bias voltage generating circuit for outputting an output voltage of a predetermined level in accordance with a control signal during a read-out mode, said bias voltage generating circuit including:

an output node, outputting the output voltage, a first MOSFET including a drain, a source connected to a power source, and a gate receiving said control signal, a second MOSFET having a source connected to said drain of said first MOSFET, a gate coupled to a ground, and a drain connected to said output node, a third MOSFET having a drain and a gate commonly connected to said output node, and including a source, a fourth MOSFET including a source coupled to ground, and having a drain and a gate commonly connected to said source of said third MOSFET, and a fifth MOSFET having a drain connected to said output node, a gate connected to said control signal and a source grounded coupled to said ground; and a digit line biasing circuit disposed between said power source and each of said digit lines, the digit line biasing circuit being conductive responsive to said output voltage from said output node of said bias voltage generating circuit for biasing all of said digit lines to said predetermined level.

* * * * *